United States Patent
Kikuchi et al.

(12)

(10) Patent No.: US 6,508,889 B2
(45) Date of Patent: Jan. 21, 2003

(54) PROCESS FOR THE PRODUCTION OF $NB_3Al$ EXTRA-FINE MULTIFILAMENTARY SUPERCONDUCTING WIRE

(75) Inventors: Akihiro Kikuchi, Ibaraki (JP); Yasuo Iijima, Ibaraki (JP); Kiyoshi Inoue, Ibaraki (JP)

(73) Assignee: National Institute for Materials Science, Ibaraki (JP)

( * ) Notice: Subject to any disclaimer, the term of this patent is extended or adjusted under 35 U.S.C. 154(b) by 110 days.

(21) Appl. No.: 09/826,826

(22) Filed: Apr. 6, 2001

(65) Prior Publication Data

US 2002/0037816 A1 Mar. 28, 2002

(51) Int. Cl.[7] .............. H01B 12/00; C22C 1/00
(52) U.S. Cl. ............ 148/98; 505/806; 505/815; 420/901; 29/599; 174/125.1
(58) Field of Search .............. 505/806, 815; 420/901; 29/599; 174/125.1; 148/98

(56) References Cited

U.S. PATENT DOCUMENTS

| 4,088,512 A | * | 5/1978 | Pickus et al. ............ 148/11.5 F |
| 4,917,965 A | * | 4/1990 | Inoue et al. ................. 428/614 |
| 5,628,835 A | * | 5/1997 | Tada et al. ...................... 148/98 |
| 6,372,054 B1 | * | 4/2002 | Kikuchi et al. ................ 148/98 |
| 6,376,099 B1 | * | 4/2002 | Inoue et al. .................. 428/615 |

* cited by examiner

*Primary Examiner*—Mark Kopec
(74) *Attorney, Agent, or Firm*—Wenderoth, Lind & Ponack, L.L.P.

(57) ABSTRACT

A high-performance $Nb_3Al$ extra-fine multifilamentary superconducting wire is produced simply and inexpensively through the improvement of critical values, Tc, $Hc_2$ and Jc, without the addition of third elements such as Ge, Si and Cu. A first rapid heating and quenching treatment is applied to an Nb/Al composite wire having an atomic ratio of Al to Nb from 1:2.5 to 1:3.5 and having an extra-fine multifilamentary structure to form a BCC alloy phase comprising Nb with Al supersaturatedly dissolved therein wherein the treatment comprises heating the composite wire up to a temperature not lower than 1900° C. within two seconds and then introducing it into a molten metal at a temperature not higher than 400° C. to rapidly quench it. The wire is subjected to a second rapid heating and quenching treatment to form an A15-$Nb_3Al$ compound having a low degree of crystalline order but having an approximately stoichiometric composition wherein the second treatment comprises heating the wire up to a temperature not lower than 1500° C. within two seconds and then introducing it into a molten metal at a temperature not higher than 400° C. Then, an additional heat treatment is conducted to improve the degree of crystalline order of the Al5-$Nb_3Al$ compound having an approximately stoichiometric composition.

7 Claims, 5 Drawing Sheets

(a) Conventional single-stage rapid heating and quenching process (b) New two-stage rapid heating and quenching process

PROCESS FOR THE PRODUCTION OF NB₃A1 EXTRA-FINE MULTIFILAMENTARY SUPERCONDUCTING WIRE

BACKGROUND OF THE INVENTION

1. Field of the Invention

The present invention relates to process for the production of $Nb_3Al$ extra-fine multifilamentary superconducting wire. More particularly, the invention concerns a process for the production of $Nb_3Al$ extra-fine multifilamentary superconducting wire which can produce simply and inexpensively high-performance $Nb_3Al$ extra-fine multifilamentary superconducting wire having three greatly-improved critical values, Tc, $Hc_2$ and Jc, without the addition of third elements such as Ge, Si and Cu, the process being promising as a practically applied technology.

2. Description of the Related Art

A process for producing $Nb_3Al$ extra-fine multifilamentary wire has been proposed in which a rapid heating and quenching treatment is applied to a composite wire of Nb and Al to form an Nb-25 at % Al supersaturated bcc alloy solid solution phase, and then an additional heat treatment at 700–900° C. is conducted to transform the Nb—Al supersaturated bcc alloy solid solution phase to an Al5.$Nb_3Al$ phase.

The $Nb_3Al$ extra-fine multifilamentary wires produced by this process have three critical values, Tc, $Hc_2$ and Jc, higher than those of the $Nb_3Al$ wires by the conventional diffusion process and, therefore, have much hope as a next practically used wire for strong magnetic fields. Although the maximum magnetic field generated by superconducting magnets using conventional metallic superconducting wires was 21.7 T, it is expected that the use of the aforementioned $Nb_3Al$ extra-fine multifilamentary wires will achieve the upper limit of magnetic field generated as high as 21 T at 4.2K and 24 T at 1.8K.

On the other hand, the improvement of performances of $Nb_3Al$ extra-fine multifilamentary wires is under studying.

For example, it has been found that the addition of Ge or Si to $Nb_3Al$ results in the direct formation of Al5 phase after rapid heating and quenching treatment, greatly enhancing Tc and $Hc_2$.

In this case, however, it has been pointed out that a large amount of impurities are also formed, Jc becomes not so high and the addition of Ge and Si greatly reduces workability of Nb/Al wires. The production of long-length wires requires enough research.

On the other hand, it has been also found that the addition of Cu results in the direct formation of the Al5 phase after a rapid heating and quenching treatment, improving characteristics. Tc reaches 18.2 T and $Hc_2$ reaches about 29 T. Furthermore, Jc is also a high value in strong magnetic fields.

For practical applications of this technology, however, there are problems in workability or the like.

SUMMARY OF THE INVENTION

The invention according to this application is created in light of such circumstances and intends to provide a process for the production of an $Nb_3Al$ extra-fine multifilamentary superconducting wire which can produce simply and inexpensively a high-performance $Nb_3Al$ extra-fine multifilamentary superconducting wire having three greatly-improved critical values, Tc, $Hc_2$ and Jc, without the addition of third elements such as Ge, Si and Cu, the process being promising as a practically applied technology.

To solve the above problems, the invention according to this application provides, in a first aspect, a process for the production of an $Nb_3Al$ extra-fine multifilamentary superconducting wire, the process comprising the steps of: applying a first rapid heating and quenching treatment to an Nb/Al composite wire having an atomic ratio of Al to Nb from 1:2.5 to 1:3.5 and having extra-fine multifilamentary structure to form a BCC alloy phase comprising Nb with Al supersaturatedly dissolved therein wherein the first treatment comprises heating the composite wire up to a temperature not lower than 1900° C. within two seconds and then introducing it into a molten metal at a temperature not higher than 400° C. to rapidly quench it; applying a second rapid heating and quenching treatment to form an Al5 pahse-$Nb_3Al$ compound having a low degree of crystalline order but having a composition near the stoichiometric one wherein the second treatment comprises heating the wire up to a temperature not lower than 1500° C. within two seconds and then introducing it into a molten metal at a temperature not higher than 400° C.; and applying, after the second rapid heating and quenching treatment, an additional heat treatment at 600–850° C. to the composite wire to improve the degree of crystalline order of the Al5 phase.$Nb_3Al$ compound.

The invention according to this application also provides, in a second aspect, the process further comprising a step, conducted before or after the additional heat treatment, of coating the composite wire with Cu. The invention provides, in a third aspect, one of the processes further comprising a step, conducted before the first rapid heating and quenching treatment, of compounding Cu or Ag for stabilizing in a state where a diffusion barrier is incorporated. The invention also provides, in a fourth aspect, one of the processes further comprising a step, conducted between the first rapid heating and quenching treatment and the second rapid heating and quenching treatment, of cold working at reduction of area of 70% or less.

DETAILED DESCRIPTION OF THE PREFERRED EMBODIMENTS

The present invention has the aforementioned features and its embodiments are described below.

The invention according to this application is basically characterized, an a process for producing an $Nb_3Al$ extra-fine multifilamentary superconducting wire, by applying the following thermal treatments to an Nb/Al composite wire without the conventional addition of third elements such as Ge, Si and Cu to improve critical values, Tc, $Hc_2$ and Jc, and thereby producing simply a high-performance $Nb_3Al$ superconducting wire.

<I> Heating a composite wire up to a temperature not lower than 1900° C. within two seconds and then introducing it to a molten metal at a temperature not higher than 400° C., thereby forming a BCC alloy phase comprising Nb with Al supersaturatedly dissolved therein (First rapid heating and quenching treatment)

<II> Heating a composite wire up to a temperature not lower than 1500° C. within two seconds and then introducing it to a molten metal at a temperature not higher than 400° C., thereby forming an Al5 phase-$Nb_3Al$ compound having a low degree of crystalline order but having an approximately stoichiometric composition (Second rapid heating and quenching treatment)

<III> Conducting an additional heat treatment, at a temperature from 600 to 850° C., thereby improving a degree of crystalline order of the Al5 phase-$Nb_3Al$ compound having a composition close to stoichiometric one (Additional heat treatment)

The Nb/Al composite wire that is the subject of the thermal treatments in one having an atomic ratio of Al to Nb ranging from 1:2.5 to 1:3.5 It preferably has an average diameter of 2 mm or less, or an average thickness of 2 mm or less in case an Nb/Al composite wire is like tape. Futhermore, it also has an extra-fine multifilamentary structure that a large number of micro composite core wires which has an average diameter of 200 $\mu$m or less, preferably 80 $\mu$m or less, are embedded in a matrix material comprising Nb, Ta, Nb base alloy or Ta base alloy. The definition of "a large number" means several tens to several millions. As such an Nb/Al composite wire, extra-fine multifilamentary structured composite wires mede by various composite processing methods conventionally known, such as rod-in-tube method, jelly roll method, clad chip extrusion and powder metallurgical method are used.

When the atomic ratio of Al to Nb is out of the range from 1:2.5 to 1:3.5, it is difficult to obtain $Nb_3Al$ superconducting wires with good performance. Nb/Al composite precursor wires close to the commercial level are available for such Nb/Al composite wires.

Figure 1:
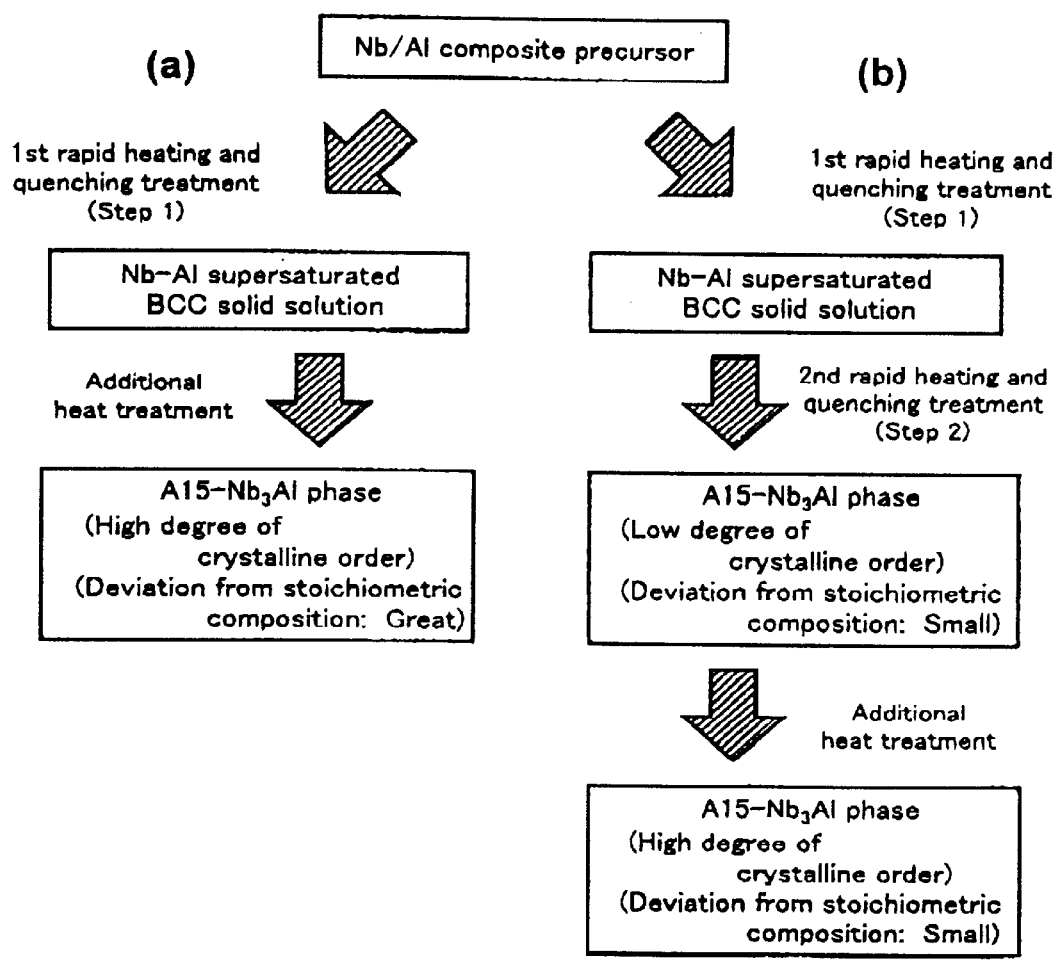
FIG. 1 in a schematic diagram showing the features of the process (b) according to the present invention over a conventional process (a)

For example, FIG. 1 illustrates the difference between the process of the invention according to this application and the conventional rapid heating and quenching process. As previously described, the rapid heating and quenching process according to the present invention basically differs from the conventional process in the fact that an Al5-$Nb_3Al$ phase having a low degree of crystalline order but having an approximately stoichiometric composition is formed through the second rapid heating and quenching treatment and then a higher degree of crystalline order is obtained in the additional heat treatment.

Figure 2:
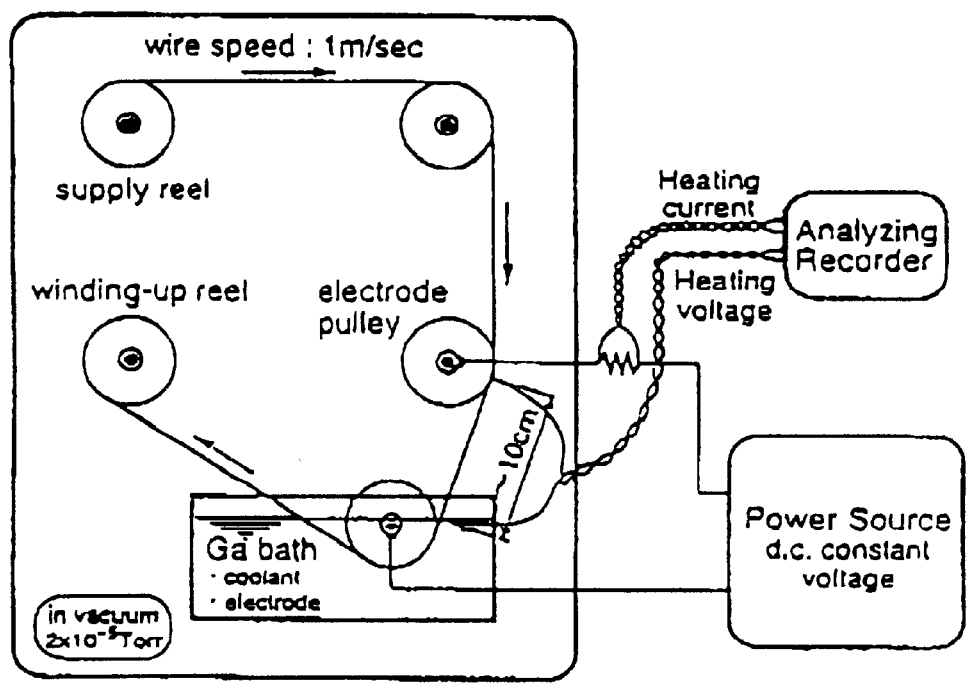
FIG. 2 in a schematic diagram illustrating an example of an electric apparatus for rapid heating and quenching.

The process of the invention according to this application can be carried out by use of an electric heating apparatus as illustrated in FIG. 2, for example. In the example shown in FIG. 2, an Nb/Al composite wire supplied, as a wire, from a supply real is electrically heated and then is rapidly quenched in a molten Ga (gallium) bath. A molten bath is not restricted to that of Ga and may be any one which is inert and can be maintained at 400° C. or lower.

In the invention according to the present application, the first rapid heating and quenching treatment is first conducted by using the apparatus shown in FIG. 2. That is, a composite wire is rapidly heated to a high temperature of 1900° C. or higher by electric heating and subsequently is subjected to rapid quenching treatment through its continuous introduction to a liquid metal maintained at a temperature of 400° C. or lower, for example, at almost room temperature. Such a rapid heating and quenching treatment results in the formation of a BCC phase comprising Nb with Al supersaturatedly dissolved therein. Then the BCC phase is, as usual, subjected to an additional heat treatment at about 800° C. to be transformed to an Al5-$Nb_3Al$ phase, resulting in high Jc. At this time, Tc and $Hc_2$ are about 17.8 T and about 26 T, respectively. As described above, the Al5-$Nb_3Al$ phase formed by the additional beat treatment via a supersaturated BCC solid solution phase according to the conventional rapid heating and quenching process in closer to a composition ratio than the Al5 phase formed by the diffusion process at 700–600° C. However, Tc and $Hc_2$ are slightly low because of a deviation of a composition to one in which is slightly rich in Nb. It seems that although an atomic ratio of Nb to Al in the supersaturated BCC solid solution phase formed after the rapid heating and quenching treatment is maintained at 3:1, the deviation of the composition occurs during the transformation to the Al5-$Nb_3Al$ phase since the transformation is conducted at 700–900° C.

Unlike the conventional process, the process of the invention according to this application is carried out, instantaneously and continuously, the transformation from the supersaturated BCC solid solution phase to the Al5 phase within two seconds at a high temperature not lower than 1500° C., for example at about 1800° C., by using, for example, an electric heating apparatus. That is, the second rapid heating and quenching treatment is performed. To conduct the transformation from the supersaturated BCC solid solution phase to the Al5 phase instantaneously at high temperature can render the deviation from the stoichiometric composition ratio caused by the transformation small. Since the Al5-$Nb_3Al$ phase formed just after the second rapid heating and quenching treatment has little deviation from the stoichiometric composition ratio but has a low degree of crystalline order, it has a Tc as low as about 14.5 K. In the present invention, the heat treatment at 600–850° C. for the recovery (improvement) of degree of long-distance order of crystals elevates Tc to about 18.5 K. This value is at least 0.5 K higher in comparison with the samples subjected to the conventional single rapid heating and quenching treatment. Furthermore, $Hc_2$ (4.2 K) reaches 30 T and a great improvement in super strong magnetic field characteristics can be realized without the addition of third elements such as Ge and Si. Jc (4.2 K) of this wire reaches about 200 A/mm$^2$ at 25 T and the wire has characteristics equivalent to those of 20 at % Ge-added $Nb_3(Al,Ge)$ superconductor. Moreover, the wire exhibits the highest Jc (4.2 K) among the conventional metallic superconducting extra-fine multifilamentary wires; about 250 A/mm$^2$ at 24 T and about 300 A/mm$^2$ at 23 T.

In the above-mentioned process according to the present invention, the heating temperature in the second rapid heating and quenching treatment must be lower than that in the first rapid heating and quenching treatment. If higher, no Al5 phase $Nb_3Al$ compound will form through the second rapid heating and quenching treatment. Furthermore, it is not desirable to increase the heating time in the rapid heating and quenching treatment since it results in the decrease of the rate of quenching. In practice, heating for two seconds or less, or for 0.1 second is sufficient.

Cold working at reduction of area of 70% or less after the first rapid heating and quenching treatment is effective for performance improvement. If the reduction of area is over 70%, however, final Jc is decreased.

Furthermore, in the present invention, Cu coating may be conducted before or after the additional heat treatment. Compounding with Cu or Ag may also be conducted as a diffusion barrier before the first rapid heating and quenching treatment.

The following examples illustrate the embodiments of the present invention more in detail, however, are not intended to limit the invention.

EXAMPLES

Example 1

By use of a continuous rapid heating and quenching apparatus shown in FIG. 2, the first heating and quenching treatment was applied to an Nb/Al composite extra-fine multifilamentary wire prepared by a method comprising drawing a composite obtained by overlapping and rolling an Nb sheet and an Al sheet (the jelly roll method). The composite wire was moved at a rate of 1 m/sec and was rapidly, electrically heated to 2000° C. in 0.1 second between a Ga bath and a electrode pulley. The composite wire was subsequently passed through a Ga bath maintained at 50° C., thereby being rapidly quenched (rapid quenching rate: $1 \times 10^{5}$° C./sec). The Ga bath played roles of an electrode and a refrigerant. The X-ray diffraction confirmed that an Nb—Al supersaturated BCC solid solution alloy phase was formed in the wire after the first rapid heating and quenching treatment. The wire was subjected to rapid heating and quenching treatment. The wire was electrically heated between the Ga bath and the electrode pulley while being moved at a rate of 1 m/sec also in the second rapid heating and quenching treatment. Differing from the first rapid heating and quenching treatment, temperature was set at 1900° C. in the second rapid heating and quenching treatment. A treating time was set to 0.1 second. Then the wire was passed through a Ga bath maintained at 50° C., thereby being rapidly quenched. The wire after the second rapid heating and quenching treatment was subjected to an additional heat treatment at 800° C. for twelve hours in a vacuum ($10^{-5}$–$10^{-6}$ Torr). It was confirmed that the treatment similar to that described above conducted while maintaining the Ga bath being maintained at 150° C. lead to almost the same results.

Figure 3:
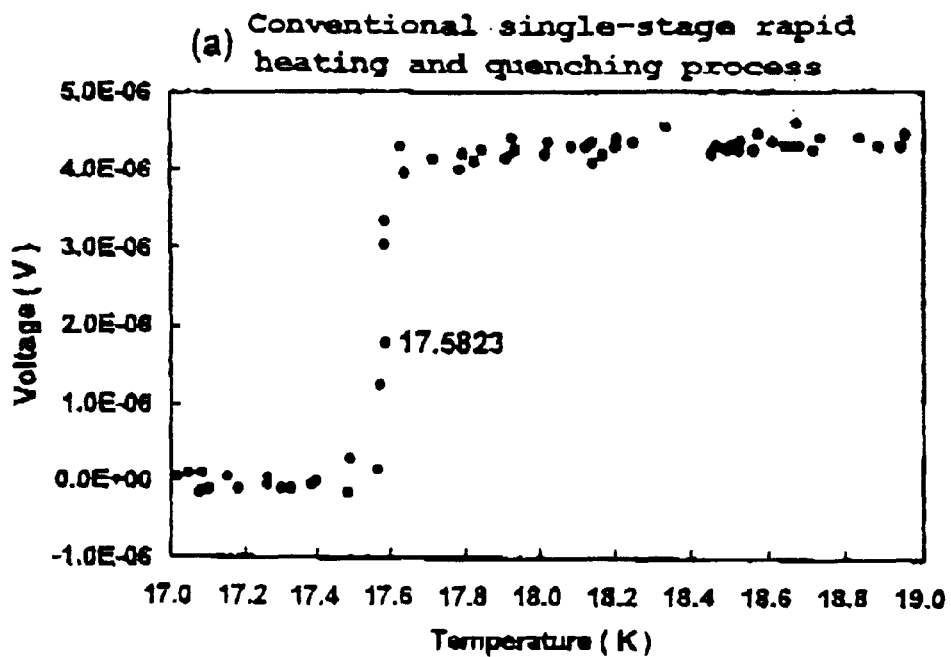
FIG. 3 is a diagram showing a transition curve of superconducting resistance and compares Tc of the sample (a) prepared by the conventional single-stage heating and quenching process and that of the sample (b) by the new two-stage rapid heating and quenching process of the present invention.
Figure 3:
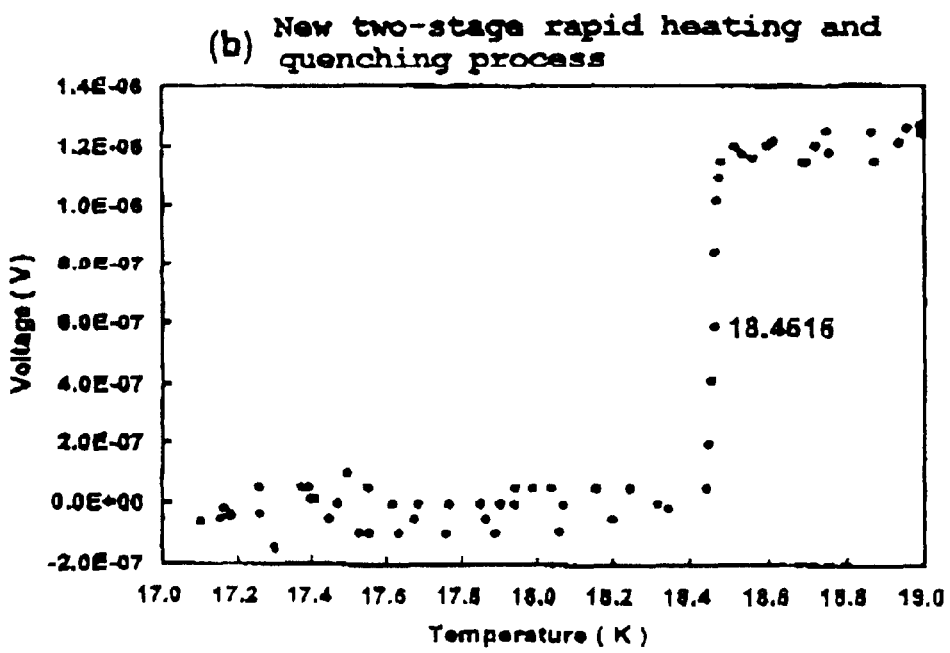

The X-ray diffraction revealed that an Al5 phase had been formed in the wire after the second rapid heating and quenching treatment and it had Tc of about 14.5 K. The additional heat treatment at 800° C. recovered the degree of long-distance order of crystals and improved Tc to 18.4 K, this being at least 0.5 K higher in comparison with the samples by a conventional single rapid heating and quenching treatment. It can be considered that the transformation and crystallization at a high temperature of 1900° C. and in an extremely short time made the atomic ratio of Nb to Al in the Al5 phase close to 3:1, the stoichiometric composition. FIG. 3 is a transition curve of superconducting resistance and compares Tc of the sample prepared by the conventional heating and quenching process and that of the sample by the two-stage rapid heating and quenching process of the present invention.

Figure 4:
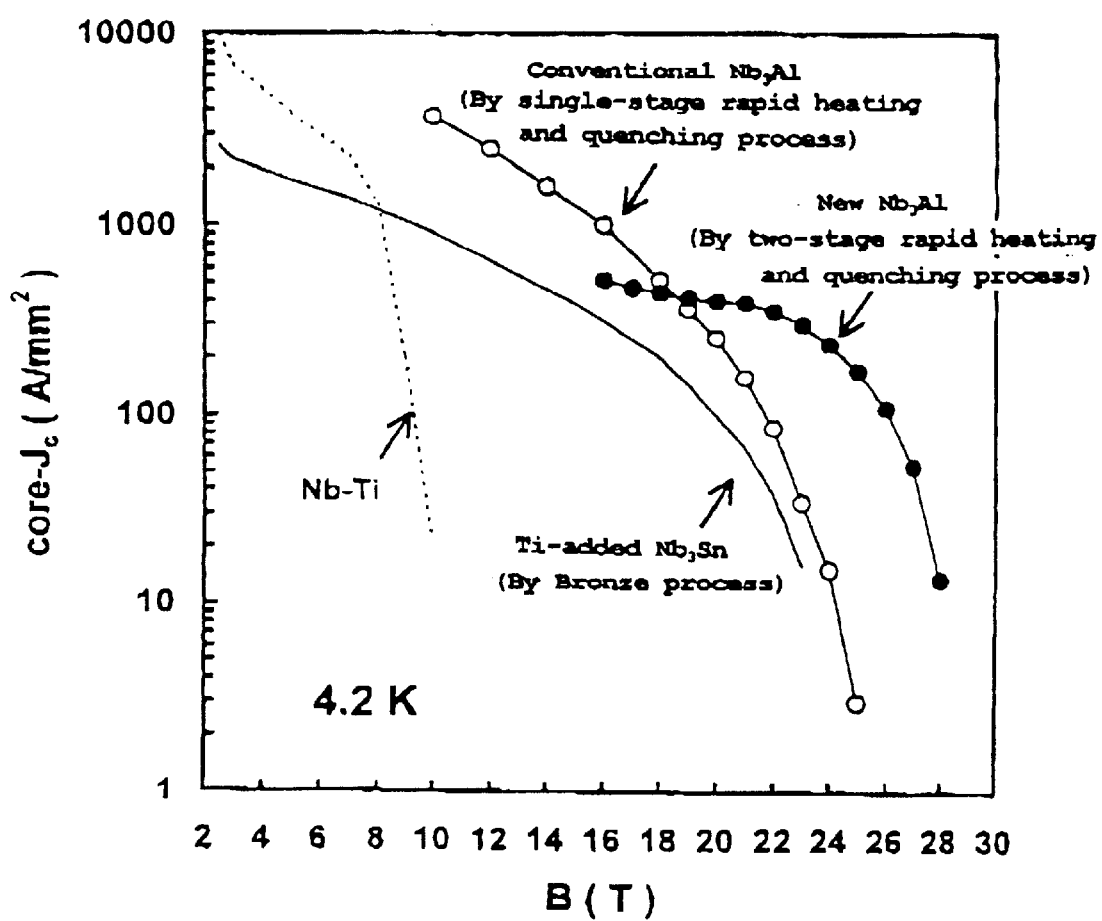
FIG. 4 is a diagram showing a superconducting Jc-B curve at 4.2 K of four superconducting extra-fine multifilamentary wires, Conventional $Nb_3Al$ (by single-stage rapid heating and quenching process), New $Nb_3Al$ (by two-stage rapid heating and quenching process), Ti-added $Nb_3Sn$ (by Bronze process) and Nb—Ti.

Moreover, when the maximum temperature in the second rapid heating and quenching treatment was set equal to or higher than that in the first rapid heating and quenching treatment (2000° C.), the transformation from the Nb-Al supersaturated BCC solid solution to the Al5-$Nb_3Al$ phase did not occur. FIG. 4 includes Jc-B curves of various kinds of superconducting extra-fine multifilamentary wires at 4.2 K. Jc (4.2 K) of the $Nb_3Al$ extra-fine multifilamentary wire prepared by the process of the present invention reached about 200 A/mm$^2$ at 25 T and super-strong magnetic field characteristics was improved without any addition of third elements such as Ge and Si. Moreover, Jc (4.2 K) was about 250 A/mm$^2$ at 24 T and about 300 A/mm$^2$ at 23 T even when a magnetic field was reduced to about 18 T, Jc (4.2 K) was dramatically higher than that of the $Nb_3Al$ wire by the conventional single -stage rapid heating and quenching process. Such results obtained in this magnetic field range break the record of Jc for practically usable metallic superconducting wire having a extra-fine multifilamentary structure and are worthy of special remark. Moreover, $HC_2$ (4.2 K) of the wire of the present invention phenomenally reached 30 T without the addition of third elements such as Ge. The addition of Ge is very effective for the improvement of Tc and $Hc_2$, but, on the other hand, it deteriorates drawabilities of wires. In contrast to this, the two-stage rapid heating and quenching process of the present invention can result in excellent super-strong magnetic field characteristics by using precursor wires of a developing level close to the commercial base established by the drawing technology. The appearance of the wire according to the present invention makes the 25T–28T superconducting magnet, which has conventionally been only a dream, possible to be realized at low cost after only a short-term development. The wire of the invention has an enormous ripple effect on various uncharted fields of research such as high-energy physics and explanation of superorganization structure of proteins.

Example 2

Figure 5:
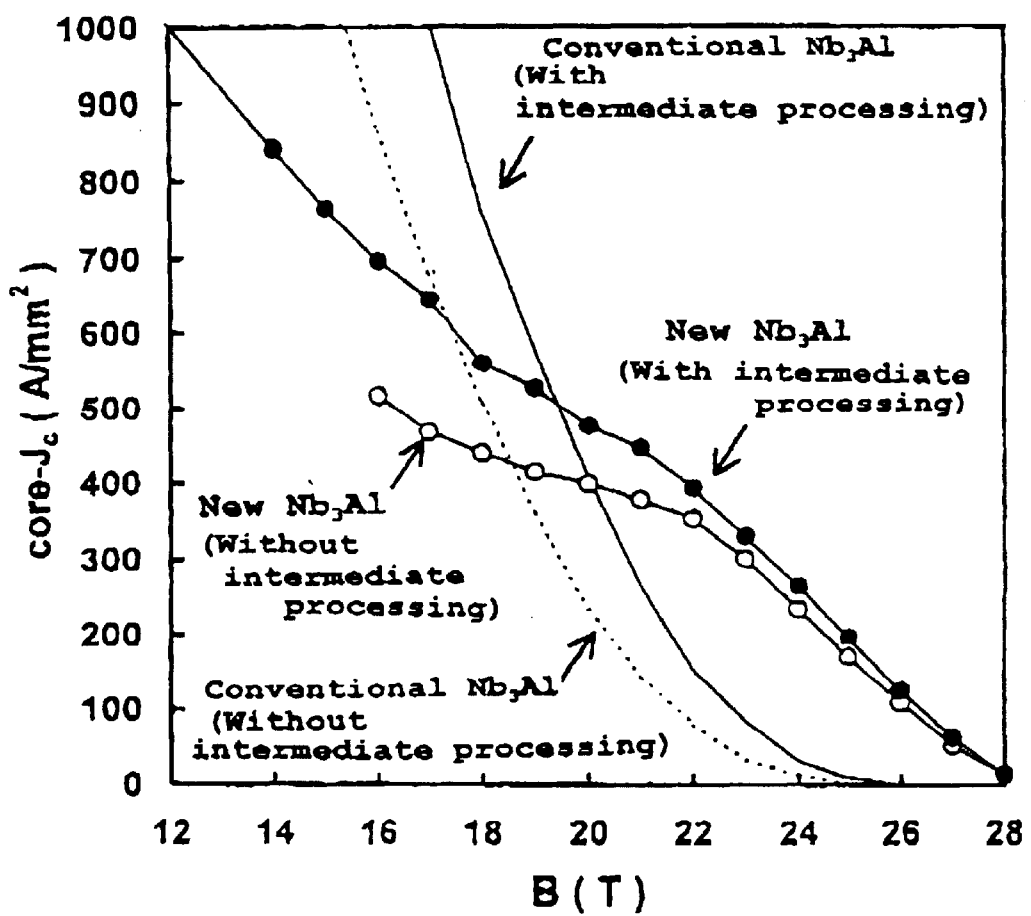
FIG. 5 is a diagram showing the effect of an Intermediate processing represented by the change of a superconducting Jc-B curve for Conventional $Nb_3Al$ (by single-stage rapid heating and quenching process) and New $Nb_3Al$ (by two-stage rapid heating and quenching process).

In the previous Example 1, a part of wires were subjected to an intermediate drawing after the first rapid heating and quenching treatment and then subjected to the second rapid heating and quenching treatment. The reduction of area of the wires during the intermediate drawing was about 50%. FIG. 5 illustrates the change of Jc (4.2 K)-B curves depending upon whether the intermediate processing after the first rapid heating and quenching treatment is conducted or not. It was confirmed that the introduction of the intermediate processing after the first rapid heating and quenching treatment obviously improved Jc. However, when the reduction of area was 70% or more, the reduction of Jc was observed.

As previously described in detail, the invention according to the present application provides an $Nb_3Al$ superconducting wire having excellent Tc, $Hc_2$ and Jc characteristics simply by using an Nb/Al composite wire (precursor wire) whose drawing technology has been established. The newly developed wire is going to realize the 25–28T superconducting magnet, which has been conventionally thought to be only a dream.

What is claimed is:

1. A process for the production of an $Nb_3Al$ extra-fine multifilamentary superconducting wire, the process comprising the steps of: applying a first rapid heating and quenching treatment to an Nb/Al composite wire having an atomic ratio of Al to Nb from 1:2.5 to 1:3.5 and having extra-fine multifilamentary structure to form a BCC alloy phase comprising Nb with Al supersaturatedly dissolved therein wherein the first treatment comprises heating the composite wire up to a temperature not lower than 1900° C. within two seconds and then introducing it into a molten metal at a temperature not higher than 400° C. to rapidly quench it; applying a second rapid heating and quenching treatment to form an A15 phase-$Nb_3Al$ compound having a low degree of crystalline order but having an approximately stoichiometric composition wherein the second treatment comprises heating the wire up to a temperature not lower than 1500° C. within two seconds and then introducing it into a molten metal at a temperature not higher than 400° C.; and applying, after the second rapid heating and quenching treatment, an additional heat treatment at 600–850° C. to the composite wire to improve the degree of crystalline order of the A15-$Nb_3Al$ compound.

2. The process for the production of an $Nb_3Al$ extra-fine multifilamentary superconducting wire according to claim 1, further comprising the step of coating the composite wire with Cu before or after the additional heat treatment.

3. The process for the production of an $Nb_3Al$ extra-fine multifilamentary superconducting wire according to claim 2, further comprising the step of compounding Cu or Ag for stabilizing in a state where a diffusion barrier is incorporated before the first rapid heating and quenching treatment.

4. The process for the production of an $Nb_3Al$ extra-fine multifilamentary superconducting wire according to claim 2, further comprising the step of cold working at reduction of area of 70% or less between the first rapid heating and quenching treatment and the second rapid heating and quenching treatment.

5. The process for the production of an $Nb_3Al$ extra-fine multifilamentary superconducting wire according to claim 1, further comprising the step of compounding Cu or Ag for stabilizing in a state where a diffusion barrier is incorporated before the first rapid heating and quenching treatment.

6. The process for the production of an $Nb_3Al$ extra-fine multifilamentary superconducting wire according to claim 5, further comprising the step of cold working at reduction of area of 70% or less between the first rapid heating and quenching treatment and the second rapid heating and quenching treatment.

7. The process for the production of an $Nb_3Al$ extra-fine multifilamentary superconducting wire according to claim 1, further comprising the step of cold working at reduction of area of 70% or less between the first rapid heating and quenching treatment and the second rapid heating and quenching treatment.

* * * * *